United States Patent [19]
Peng et al.

[11] Patent Number: 6,072,720
[45] Date of Patent: Jun. 6, 2000

[54] NONVOLATILE REPROGRAMMABLE INTERCONNECT CELL WITH PROGRAMMABLE BURIED BITLINE

[75] Inventors: Jack Zezhong Peng, San Jose; Robert M. Salter, III, Saratoga; Volker Hecht, Los Altos; Kyung Joon Han, Cupertino; Robert U. Broze, Santa Cruz; Victor Levchenko, San Francisco, all of Calif.

[73] Assignee: GateField Corporation, Fremont, Calif.

[21] Appl. No.: 09/205,876

[22] Filed: Dec. 4, 1998

[51] Int. Cl.[7] .................................................. G11C 16/04

[52] U.S. Cl. .............................. 365/185.05; 365/185.26

[58] Field of Search ...................... 365/185.05, 185.01, 365/185.26, 185.28, 185.06, 185.21; 257/321

[56] References Cited

U.S. PATENT DOCUMENTS 5,838,040  11/1998  Salter, III et al. ...................... 257/321

*Primary Examiner*—David Nelms
*Assistant Examiner*—David Lam
*Attorney, Agent, or Firm*—Townsend and Townsend and Crew LLP; Henry K. Woodward

[57] ABSTRACT

Disclosed is a FPGA cell and array structure which use FN tunneling for program and erase. Each cell comprises a switch floating gate field effect transistor and a sense floating gate field effect transistor with the floating gates being common and the control gates being common. Programming of a cell is effected through a buried bitline in juxtaposition with the switch transistor and the sense transistor over which are the floating gate and the control gate. The sense transistor can be fabricated simultaneously with fabrication of the switch transistor whereby the two transistors are identical in dopant concentrations.

29 Claims, 12 Drawing Sheets

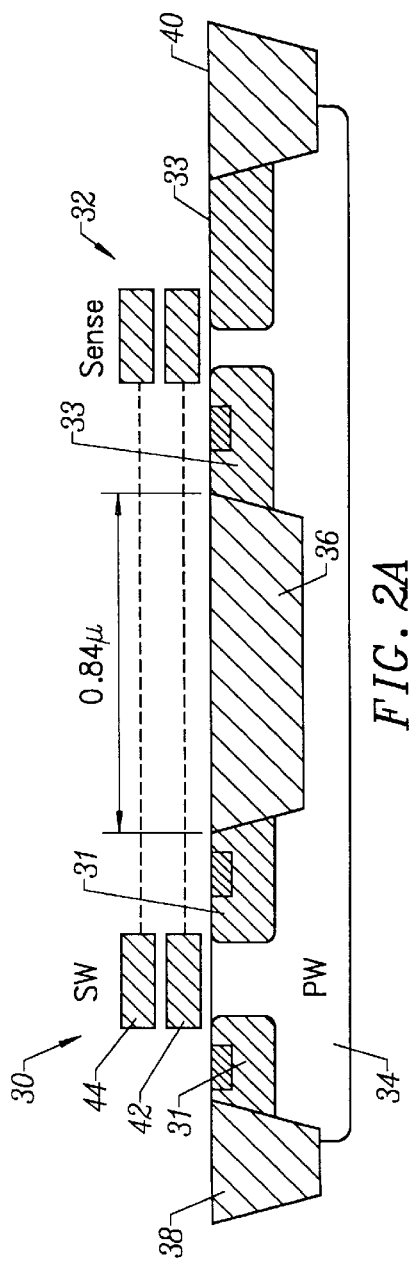
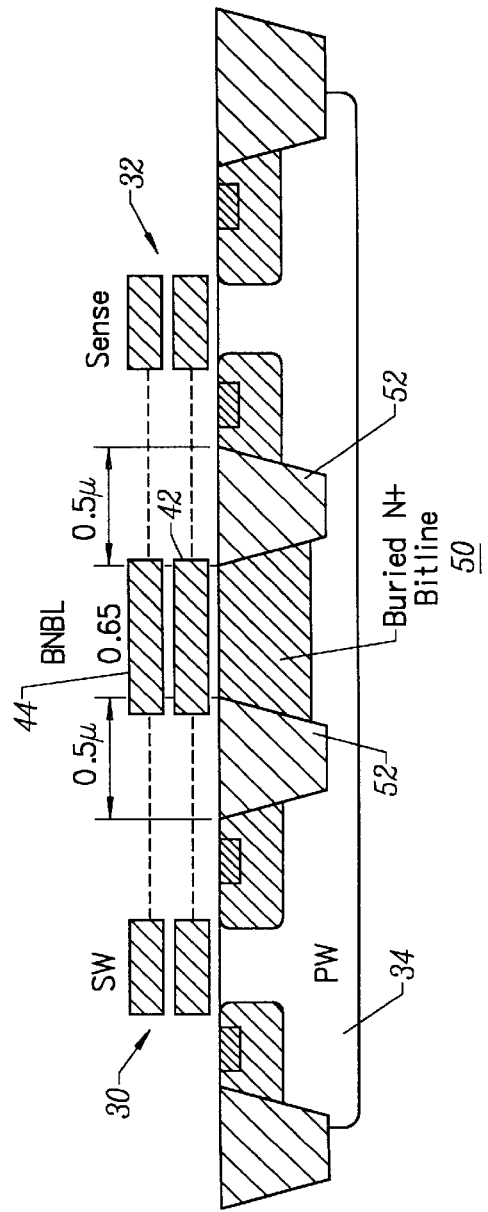
FIG. 2A
PRIOR ART
FIG. 2B

NONVOLATILE REPROGRAMMABLE INTERCONNECT CELL WITH PROGRAMMABLE BURIED BITLINE

BACKGROUND OF THE INVENTION

The present invention is related to field programmable integrated circuits, especially Field Programmable Gate Arrays (FPGAs), and more particularly, to floating gate MOS transistors used as switching elements in an FPGA.

Typically, an FPGA has an array of logic elements and wiring interconnections with thousands, or even tens of thousands, of programmable interconnects so that the FPGA can be configured by the user into an integrated circuit with defined functions. Each programmable interconnect, or switch, can connect two circuit nodes in the integrated circuit to make (or break) a wiring interconnection or to set the function or functions of a logic element.

FPGAs use either memory cells or antifuses for the programmable interconnect. Memory cells are reprogrammable and antifuses are programmable only once. A new non-volatile memory-type of programmable interconnect is disclosed in U.S. Pat. No. 5,764,096, entitled, "A GENERAL PURPOSE, NON-VOLATILE REPROGRAMMABLE SWITCH," issued Jun. 9, 1998 by Robert J. Lipp, Richard D. Freeman, Robert U. Broze, John M. Caywood, and Joseph G. Nolan, III, and assigned to the present assignee. In the FPGA described in the patent application, a non-volatile reprogrammable transistor memory (NVM) cell is used to provide a general purpose switching element to randomly interconnect FPGA wiring and circuit elements. Basically an NVM cell has an MOS transistor with a floating gate which may be charged and/or discharged. Charging and/or discharging the floating gate provides for the non-volatile programmability feature of NVM technologies.

In an FPGA, indeed, in any integrated circuit, it is important that the elements of the FPGA be as compact as possible for an efficient layout of the circuit and be as easily manufactured as possible. U.S. Pat. No. 5,633,518 by Robert U. Broze, for "Non-Volatile Reprogrammable Interconnect Cell With FN Tunneling and Programming" and assigned to the present assignee is directed toward highly compact cells of one of the programmable interconnects described in U.S. Pat. No. 5,764,096, supra. An efficient array of such interconnects, each of which is selectively programmable, is achieved. Each programmable interconnect cell has a first MOS transistor having first and second source/drains connected to first and second circuit nodes respectively, and a floating gate for turning the first MOS transistor off and on responsive to the amount of charge on the gate. The cell also has a tunneling device with one terminal connected to the floating gate of the first MOS transistor and coupled to a programming/erase line through a tunneling oxide layer, a control gate capacitively coupled to the floating gate, and at least one tunneling control line for controllably inhibiting tunneling through the oxide layer. The tunneling control line and the programming/erase line form a PN junction which is close to, but laterally displaced from, the region below the tunneling oxide layer. Under a reverse bias, the charge depletion region of the junction extends through the region below the tunneling oxide to block tunneling. This permits each programmable interconnect to be selectively programmable.

U.S. Pat. No. 5,838,040 is directed to an improved FPGA cell and array structure with improved manufacturing yield, reliability, programming speed, threshold margining, and cost. The cell includes a gate switch transistor and a gate sense transistor having common floating gates, the sense transistor also providing the programming and erasing of the switch transistor by Fowler-Nordheim (FN) electron tunneling to and from the transistor drain and the floating gate. In an array of cells or an FPGA tile, two column lines are respectively connected to the source and drain regions of the sense transistors in each column for use in sensing the threshold voltage of the sense transistor and switch transistor and thus measuring the programmed or erased state of the switch transistor.

Use of the sense transistor for programming and erasing of the switch transistor can impact the sensing function of the transistor. The sense and switch transistors should be identical devices for accurate sensing, tight distribution, and simple circuitry and fabrication steps. However, the programming and erasing function requires a non-symmetric drain junction in the sense transistor for electron tunneling between the floating gate and the drain. This asymmetry is difficult to scale down and can result in non-uniform FN programming (electron tunneling) and localized stress on the tunnel oxide. Further, the drain requires a longer channel length for preventing punch through, resulting in a larger cell height.

Other limitations are created by the fabrication of the programming drain/polysilicon gate structure. As illustrated in section view in FIG. 1, the control gate and floating gate 12 of a sense/programming transistor in silicon substrate 13 must overlap the drain 14 more than the overlap of the source to facilitate electron tunneling between the drain 14 and floating gate 12. Due to the overlap the drain doping is not uniform since ion implant 18 extends under the gate structures by ion migration during annealing, as illustrated at 20. Further, the non-uniform polysilicon gate structure which has curved or smiling bottom surfaces at the gate edges affects the drain junction edge programming speed and requires a higher bitline voltage which results in increased bitline disturb and leakage.

SUMMARY OF THE INVENTION

In accordance with the invention a separate buried bitline is provided in juxtaposition with the switch transistor and the sense transistor for programming the floating gate of a FPGA cell. The resulting cell and array structure has improved and uniform channel FN programming, and the sense and switch transistors track better since the transistors can be identical and can be fabricated in the same process steps. There is no impact of the gate polysilicon smiling since programming is effected from across the buried bit line to the overlying polysilicon and not from edges thereof Since there is no gated diode on the buried bitline, the buried bitline leakage is very small. Also, the buried implant is done before the tunnel oxide formation and has a very graded junction. The resulting FPGA cell and array is more scalable, manufacturable, and reliable.

The invention and objects and features thereof will be more readily apparent from the following description and appended claims when taken with the drawings.

BRIEF DESCRIPTION OF THE DRAWINGS

FIGS. 2A and 2B are section views of a prior art FPGA cell structure and a cell structure in accordance with one embodiment of the invention, respectively.

DETAILED DESCRIPTION OF ILLUSTRATIVE EMBODIMENTS

Figure 1:
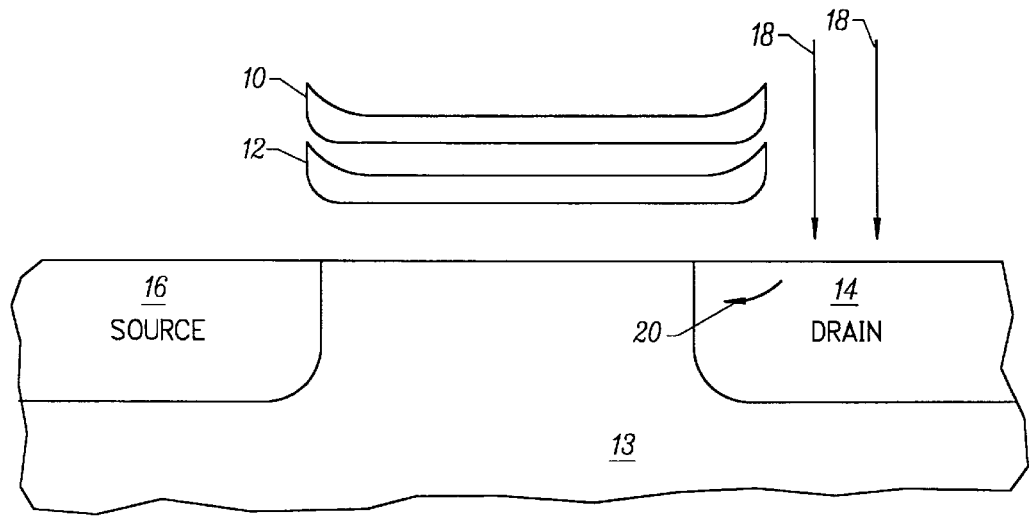
FIG. 1 is a section view illustrating the structure of a sense/programming transistor in accordance with the prior art.

Referring now to the drawings, FIGS. 2A, 2B are section views of a prior art FPGA cell and a cell in accordance with one embodiment of the present invention, respectively. The cell structures are described with respect to N channel transistors formed in P doped wells, but it will be understood that the cell structures can be P channel transistors formed in N doped wells. The prior art structure of FIG. 2A includes a switch transistor 30 and a sense transistor 32 fabricated in P well 34 with the two transistors separated by an oxide dielectric 36 of 0.84 micron length for electrical isolation. The source/drains 31 of the switch transistor 30 are formed in abutment with field oxide 38 and oxide isolation 36, and the source/drain regions 33 of sense transistor 32 are formed in abutment with field oxide 40 and the dielectric isolation 36. Switch transistor 30 and sense transistor 32 share a common floating gate 42 and control gate 44.

As illustrated and as described with reference to FIG. 1, the gate structures 42, 44 of the sense transistor must overlap the drain 33 to facilitate electron tunneling in programming the floating gate 42. This leads to fabrication and operation difficulties as described above. Further, the increased voltage required in programming the floating gate through the sense amplifier requires that the dielectric isolation 36 be of sufficient length to provide electrical isolation between the switch transistor and the sense transistor.

FIG. 2B illustrates a cross-section a FPGA cell in accordance with an embodiment of the present invention. Common elements in FIGS. 2A and 2B have the same reference numerals including switch transistor 30 and sense transistor 32. In accordance with the invention a buried N+bitline 50 is formed in the P doped well 34 in juxtaposition with (in this embodiment between) switch transistor 30 and sense transistor 32 with the polysilicon floating gate 42 and polysilicon floating gate 44 extending over buried N+bitline 50. Bitline 50 is formed between two oxide isolation regions 52 to provide electrical isolation of the buried bitline from the switch transistor 30 and sense transistor 32. Programming of the floating gate is effected from the buried N+bitline, and sense amplifier 32 flnctions only for determining the programming of the cell. Accordingly, transistors 30 and 32 can be formed in the same fabrication process steps with identical dopant concentrations and cell structures.

Figure 3:
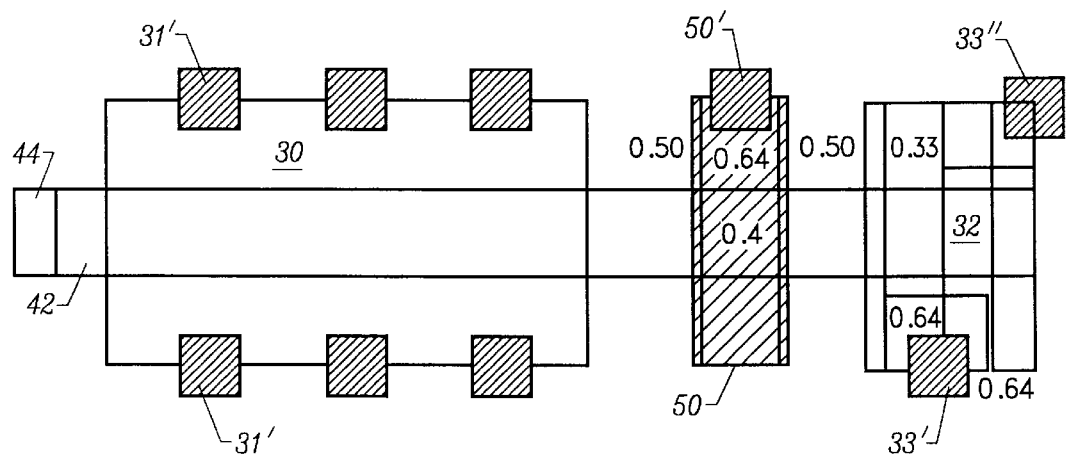
FIG. 3 is a plan view of the cell structure of FIG. 2B.

FIG. 3 is a plan view of the cell of FIG. 2B further illustrating the layout of switch transistor 30, sense transistor 32, and buried N+bitline 50. Polysilicon 1 floating gate 42 extends the length of the cell but is restricted thereto, whereas self-aligned polysilicon 2 control gate 44 extends to adjacent cell structures. Contacts 31' are provided to the source/drain regions 31 of switch transistor 30 for contacting circuit nodes, contacts 33', 33" are made to the source and drain regions 33 of switch transistor 32, and contact 50' is made to the buried N+bitline 50.

Figure 4:
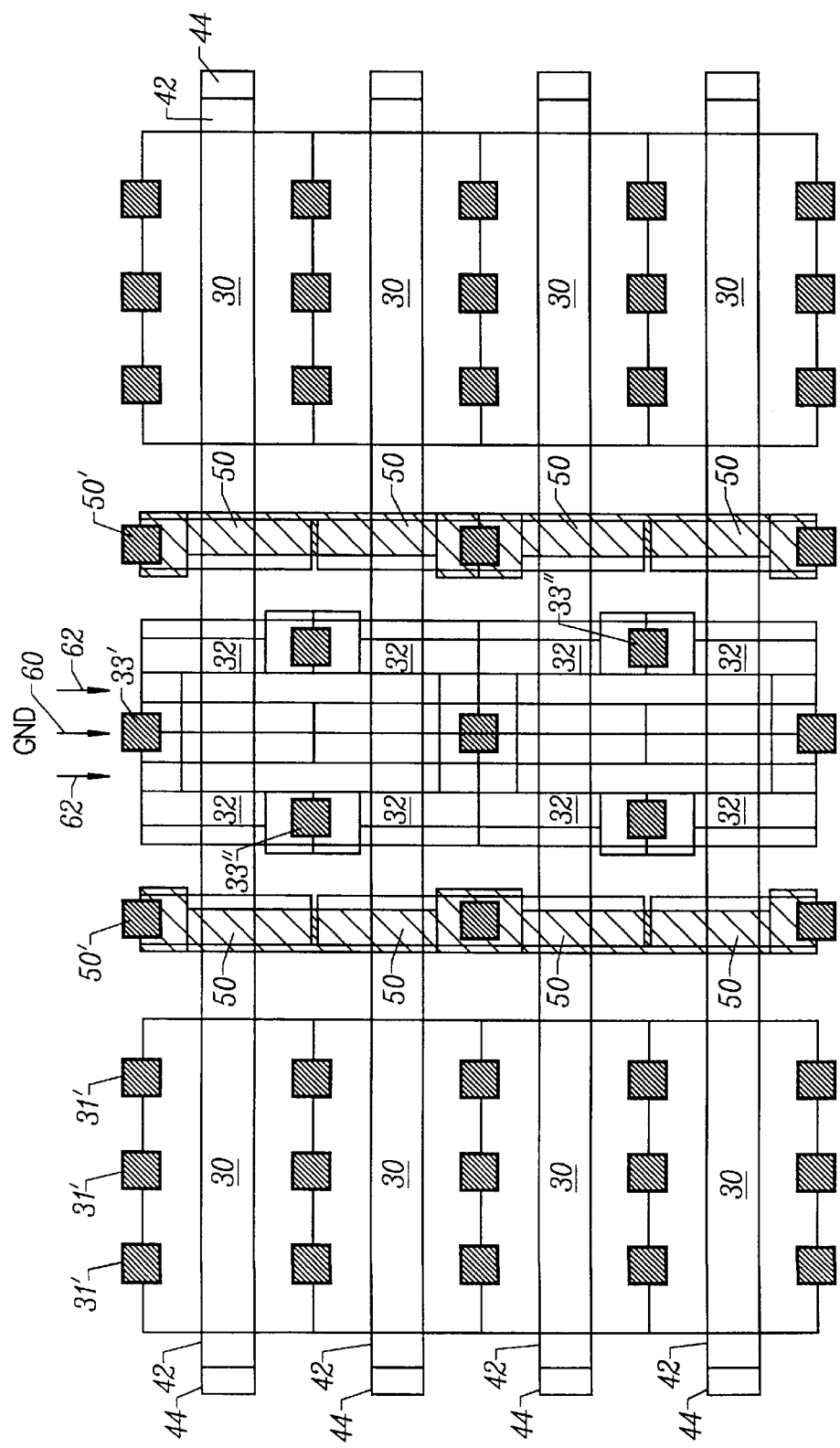
FIG. 4 is a plan view of an array of cells illustrated in FIG. 3.

FIG. 4 is a plan view of an array of cell structures as illustrated in FIG. 3, and again like elements have the same reference numerals. The cells are laid out laterally with the polysilicon control gate 44 extending laterally across all cells. Bitline 50 run vertically between switch transistor 30 and sense transistor 32 in each cell in a column. A ground line 60 runs vertically and engages contacts 33', to the source regions of the sense transistors in the stacked adjacent sense transistors. Sense lines 62 run parallel to ground line 60 and engage the drain regions of sense transistors in adjacent and stacked cells. The ground and sense lines are metal lines overlying and insulated from the cell structures. In this embodiment, sources in adjacent columns have a shared grounded source line.

Figure 5:
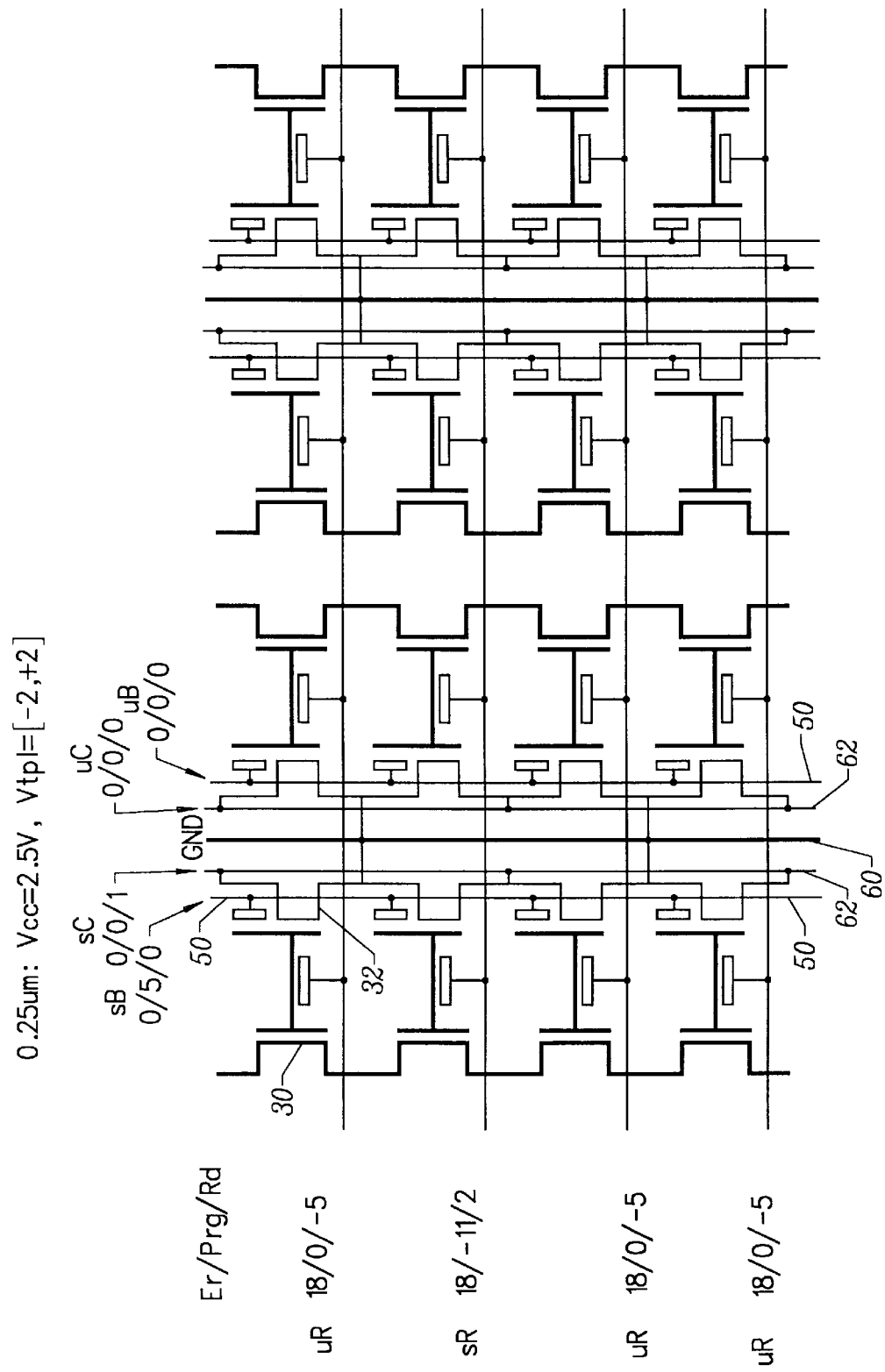
FIG. 5 is an electrical schematic of the array of cells in FIG. 4.

FIG. 5 is an electrical schematic of the array of FIG. 4 and illustrates the respective control gate voltages for erase/program/read (Er/Prg/Rd) for unselected Rows (uR) and for selected Rows (sR) respectively. The voltages are for a cell structure having 0.25 micron gate width, Vcc of 2.5 volts and $v_{tp}$=[−2 volt, +2 volt].

For erasing a cell by injecting electrons to the floating gate, the control gate is raised to 18 volts while the selected bitline (sB) and the selected column (sC) are grounded. Unselected Bitlines (uB) and unselected Columns (uC) are also grounded.

For a programming operation in which electrons are removed from the floating gate, −11 volts is applied to the control gate for the selected Row (sR) while all other control gates (uR) are grounded or raised to a positive voltage (e.g. 0 to +5 volts) to prevent Bitline disturb. The bitline for the column to be programmed (sB) is raised to +5 volts while the selected column (sB) is grounded whereby electrons flow from the floating gate to the bitline. All other bitlines (uB), column lines (uC) and rows (uR) are grounded.

During a read operation the control gate for the row (sR) to be sensed is biased to +2 volts while all other control gates (uR) are biased to −5 volts. All bitlines are grounded, and the drain line for unselected columns of cells is grounded while the drain for the selected column is biased to +1 volt. Thus with a voltage bias of 1 volt across a source and drain of the sense transistor and a control gate voltage of +2 volts, current will flow through a programmed cell while no current flows through an erased cell.

Figure 6B:
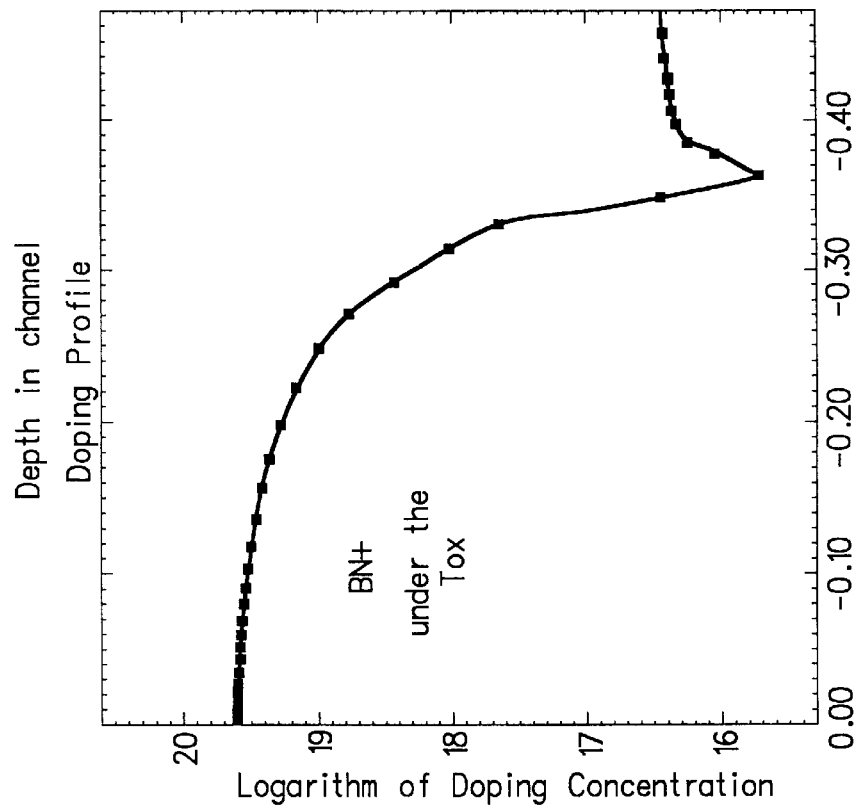
FIGS. 6A and 6B are graphs illustrating doping profiles in the buried bitline laterally along the surface and depth in the channel, respectively.
Figure 6A:
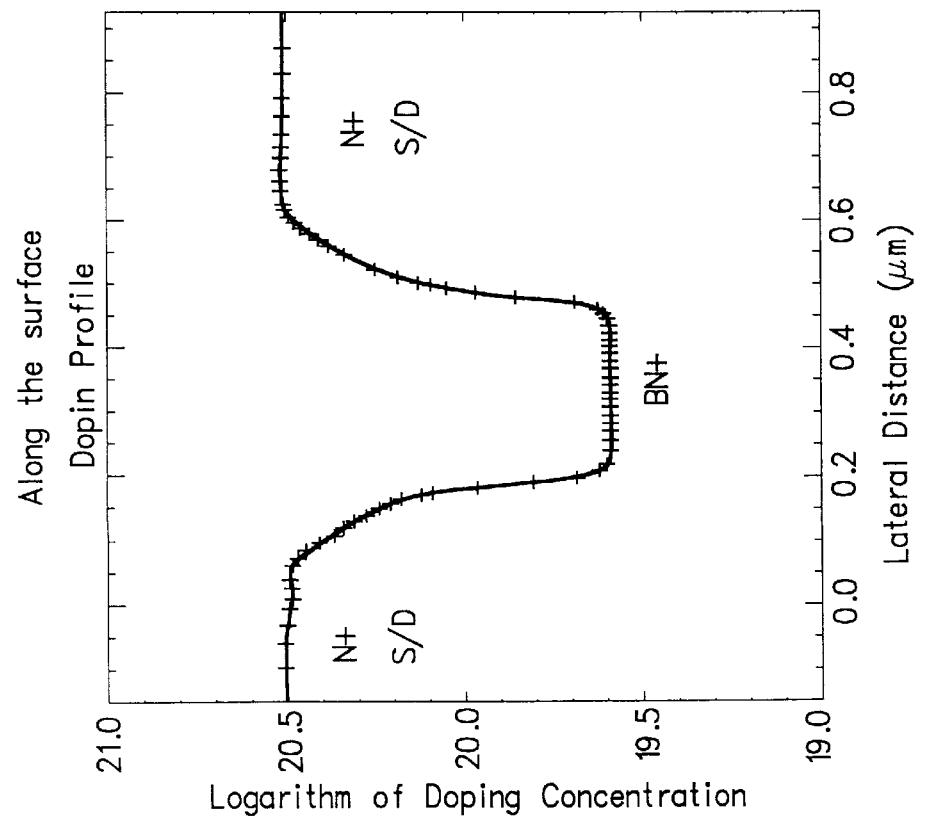

FIGS. 6A and 6B are graphs illustrating doping profile along the surface of an N+bitline and versus depth in the channel of one embodiment of the N+bitline, respectively. The doping profile across the lateral surface which varies from 1 e 20.5 for a source/drain region to 1 e 19.5 for the bitline. In FIG. 6B the dopant profile shows a generally uniform doping at 5 e 19 atoms per cubic centimeter at the surface which decreases to below 1 e 16 atoms per cubic centimeter at a depth of about −35 micron.

Figure 7B:
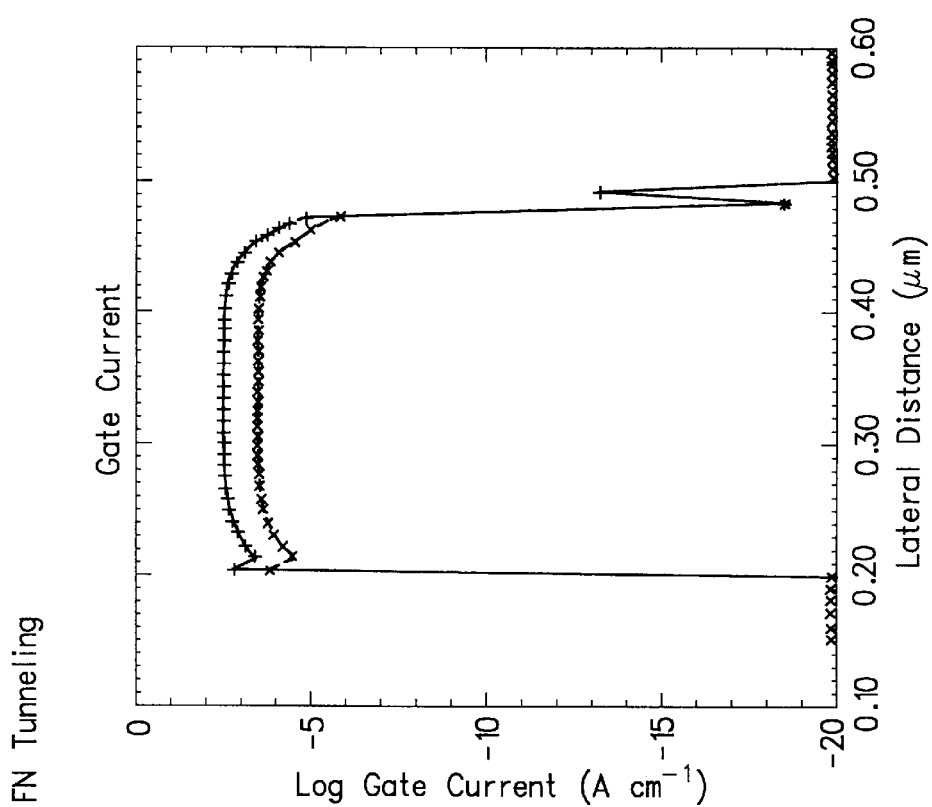
FIGS. 7A and 7B are graphs illustrating voltage potential versus buried bitline depth and gate tunneling current versus lateral distance across the buried bitline, respectively.
Figure 7A:
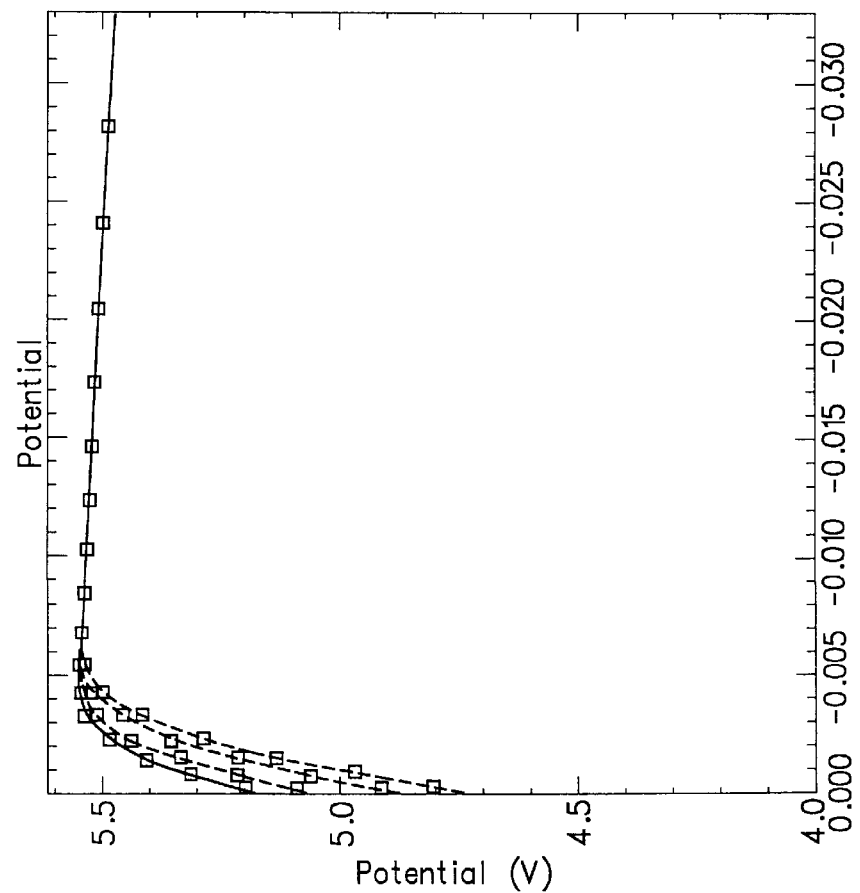

FIGS. 7A and 7B illustrate bitline potential versus depth and gate current versus lateral distance, respectively, during programming. Surface depletion is illustrated in FIG. 7A during FN tunneling with the surface potential rising over a period of time. The potential increases to 5.5 volt at a depth of −0.005 micron. FIG. 7B illustrates the uniform gate current achieved across the buried N+bitline which enhances the tunneling of current between the floating gate and the bitline.

Figure 8A:
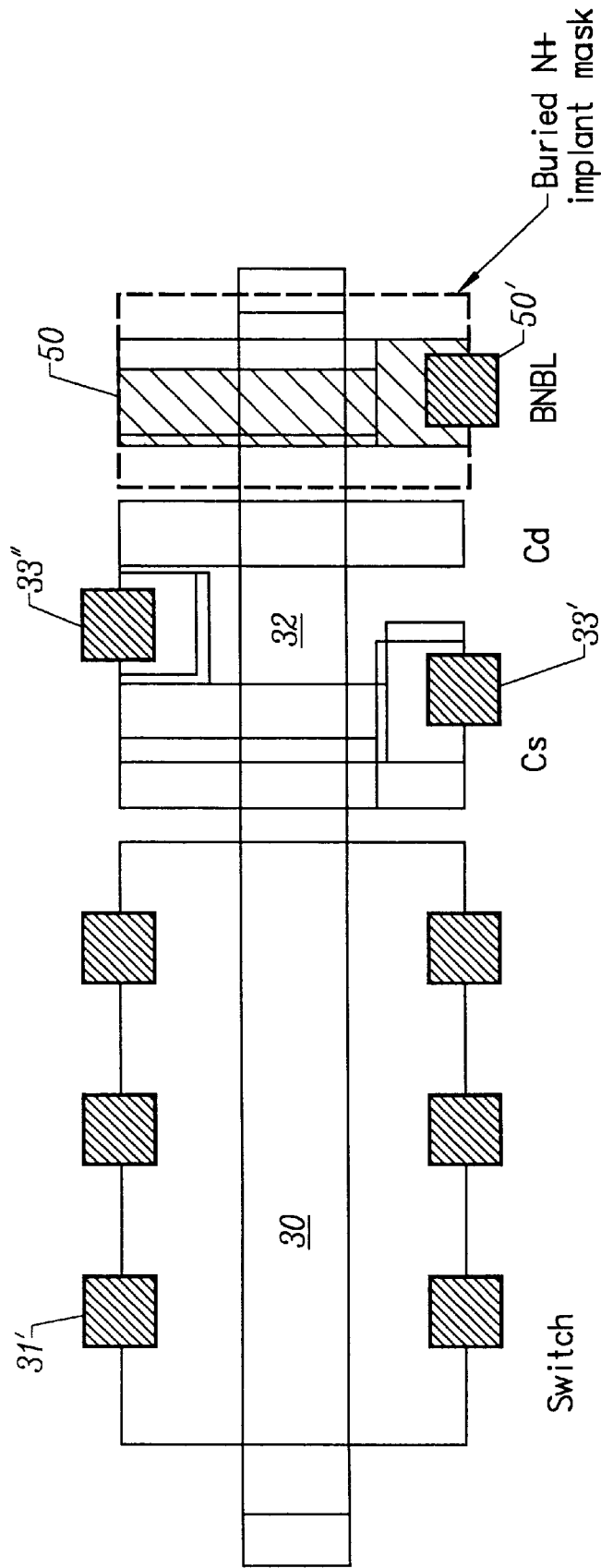
FIGS. 8A, 8B, 8C are a cell plan view, an array plan view, and a schematic in accordance with another embodiment of the invention.
Figure 8B:
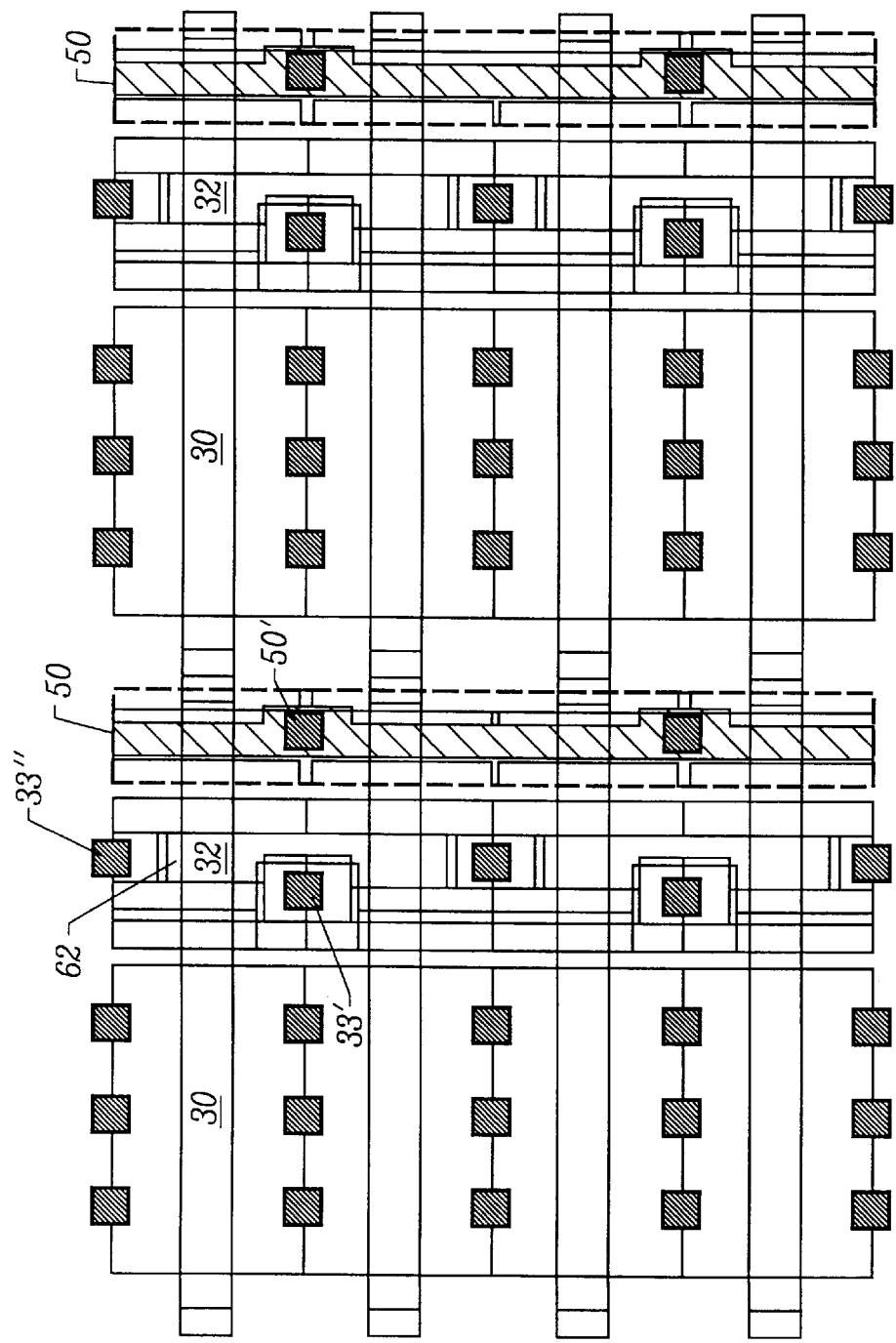
Figure 8C:
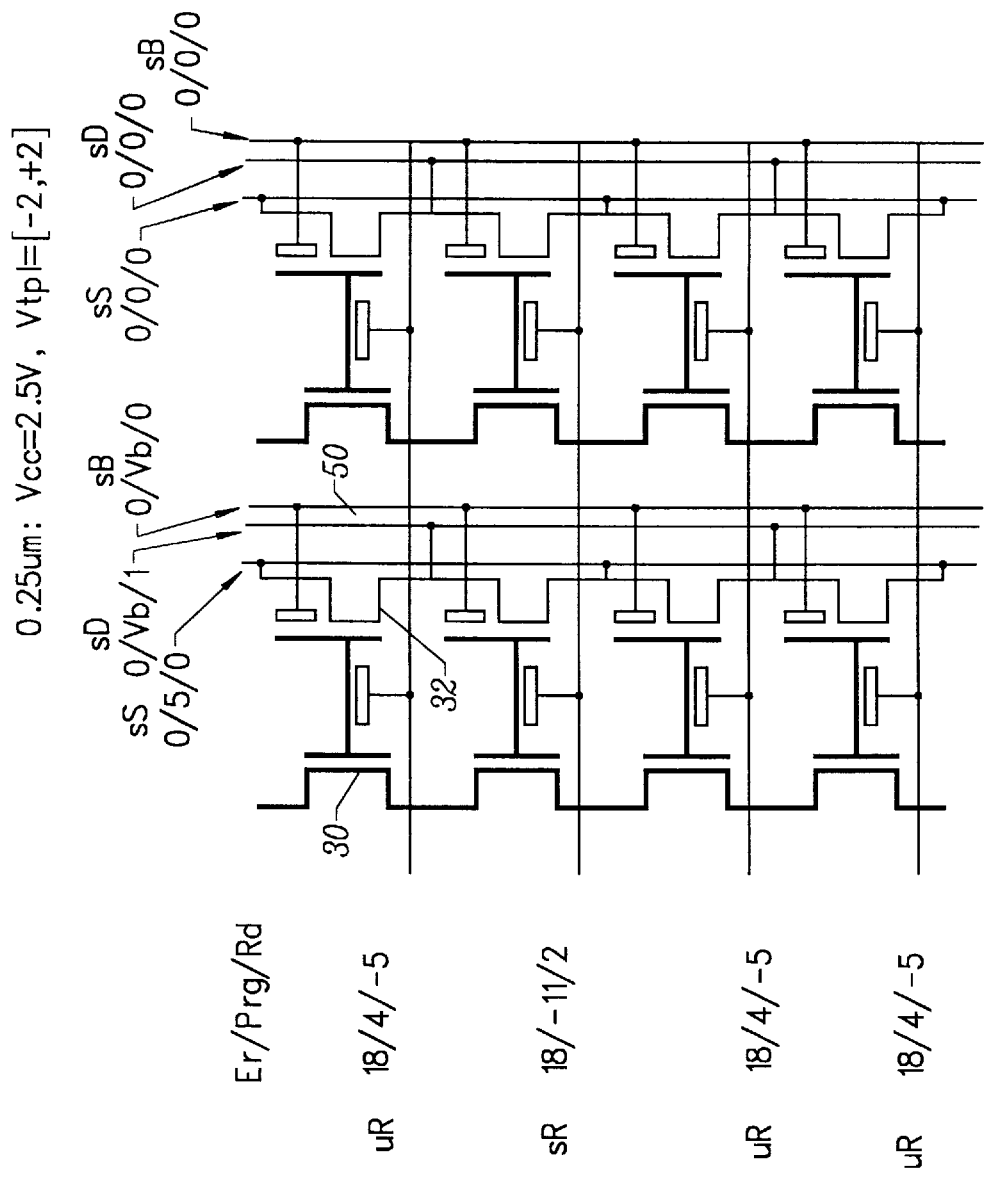

FIGS. 8A, 8B, and 8C are a cell plan view, an array plan view, and a schematic in accordance with another embodiment of the invention. Like elements in FIGS. 2 and 3 and in FIG. 8 have the same reference number. In this embodiment adjacent columns do not have a shared source line, and the cells do not have a mirrored layout. Buried N+bitline 50 is at the end of each cell and not between the switch transistor 30 and the sense transistor 32 as in FIGS. 2 and 3. Again, the floating gate and control gate are polysilicon and the source and drain line are metal. Features of this embodiment include minimal required spacing between the switch and sense transistors since no voltage higher than Vcc is between them. Also, minimal required spacing is required between the sense transistor and the BNBL if Cs and Cd lines are biased at Vcc or lower voltage when BNBL is selected.

Figure 9A:
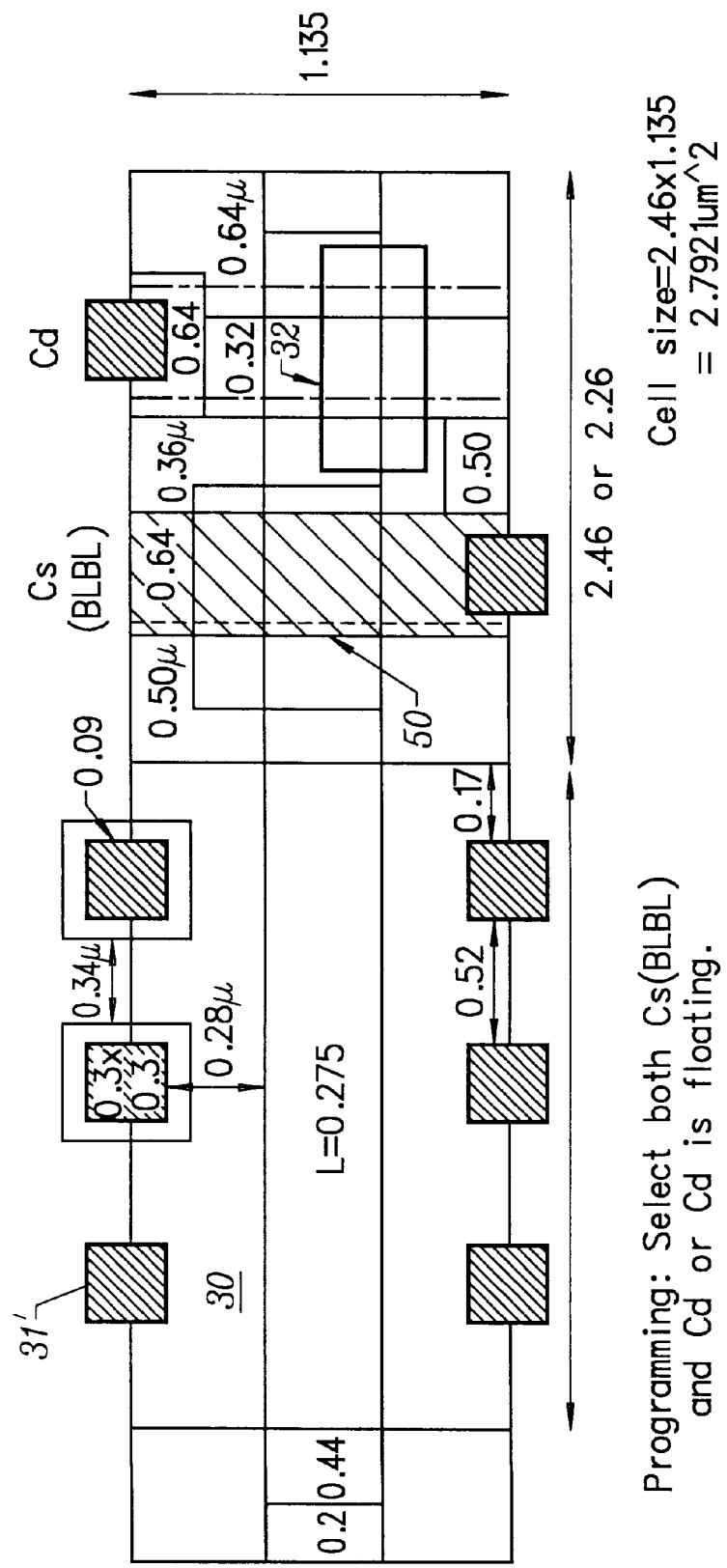
FIGS. 9A, 9B, 9C are a cell plan view, an array plan view, and a schematic in accordance with yet another embodiment of the invention.
Figure 9B:
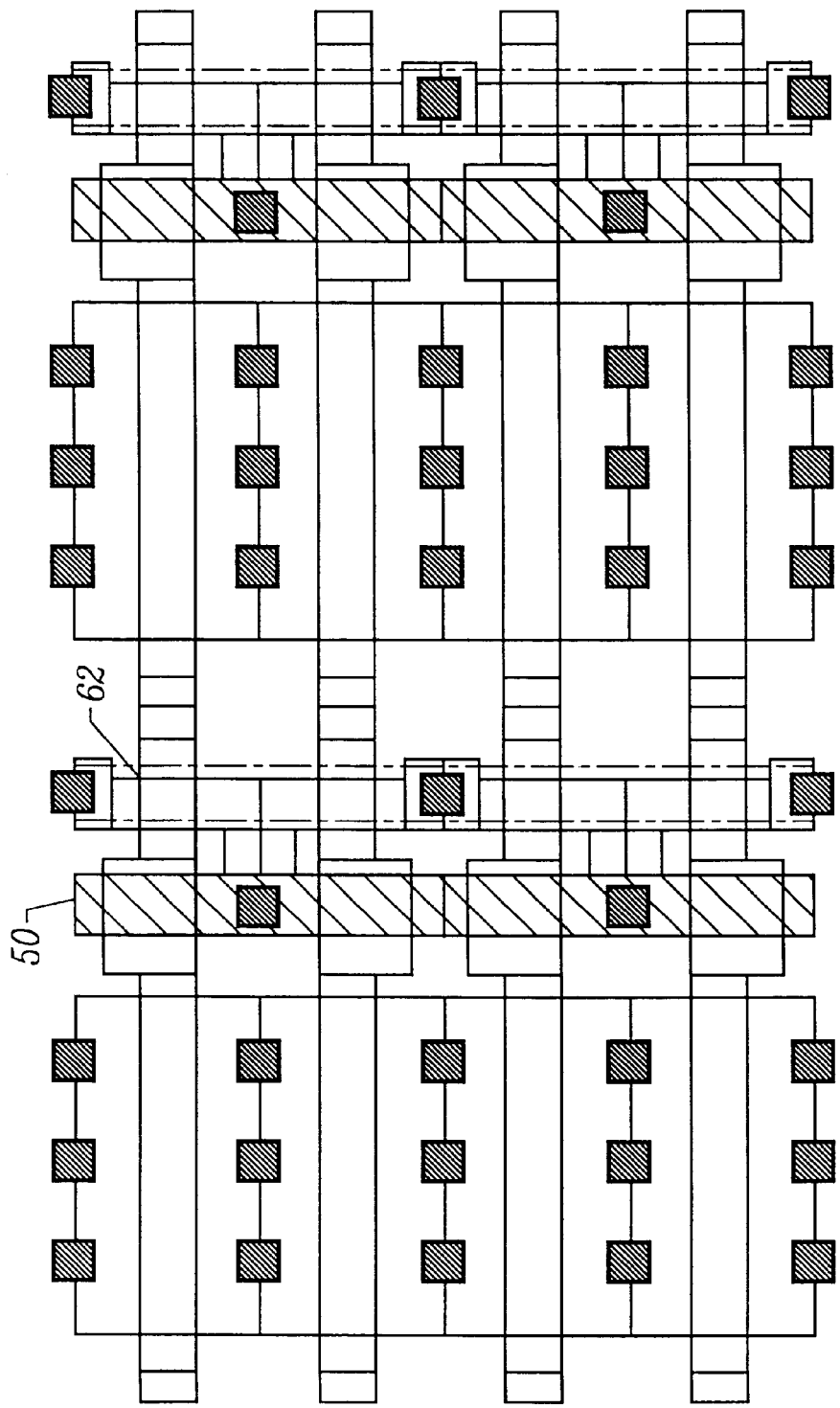
Figure 9C:
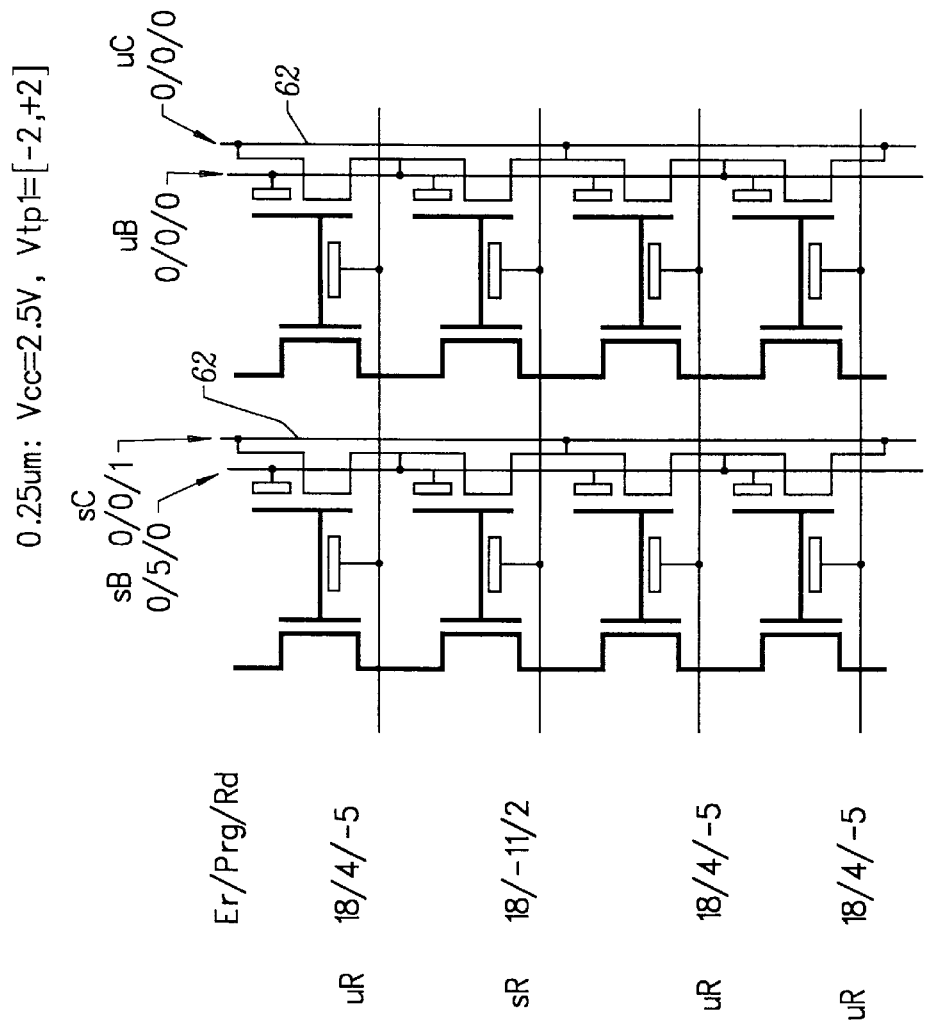

FIGS. 9A, 9B, and 9C are a cell plan view, array plan view, and schematic of another embodiment of the invention in which the buried bitline or BNBL 50 is connected to the sources of sense transistors in the same column of cells. Again, like elements have the same reference numerals with the bitline 50 placed between switch transistor 30 and sense transistor 32. A primary advantage with this embodiment the use of a single column line 62 and the bitline 50 for programming and sense. Further, uniform FN tunneling is provided for programming. However, an additional matrix implant on the source side might be needed to reduce the band to band leakage.

The described FPGA cell and array are readily fabricated using conventional EEPROM-CMOS processing with few masks. By providing the buried N+(BNBL) bitline for programming, the sense transistor and the switch transistor can be fabricated during the same process steps thereby insuring identical structures and dopant profiles. Accordingly, the sense transistor more accurately reflects the state of the programmed or erased switch transistor. The buried bitline provides uniform channel FN programming and the fabrication process provides a more scalable, manufacturable, and reliable non-volatile FPGA cell.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A programmable interconnect cell for selectively connecting circuit nodes in an integrated circuit comprising
   a) a semiconductor body having a major surface,
   b) a field effect switch transistor formed in the semiconductor body abutting the major surface, said switch transistor having first and second source/drains connected to a first and second circuit node, a floating gate for storing charge, and a control gate for turning said first field effect transistor on and off responsive to charge on the floating gate,
   c) a field effect sense transistor formed in the semiconductor body abutting the major surface and spaced from the switch transistor, said sense transistor having first and second source/drains, a floating gate for storing charge, and a control gate for turning said sense transistor on and off responsive to charge on the floating gate, and
   d) a buried bitline formed in the semiconductor body abutting the major surface in juxtaposition with the switch transistor and the sense transistor, a floating gate overlying the buried bitline and separated therefrom by a tunnel oxide, and a control gate overlying the floating gate, the floating gate of the switch transistor, the sense transistor and the buried bitline being interconnected, and the control gate of the switch transistor, the sense transistor, and the bitline being interconnected.

2. The programmable interconnect cell as defined by claim 1 wherein the floating gates comprise a first polysilicon line.

3. The programmable interconnect cell as defined by claim 2 wherein the control gates comprise a second polysilicon line.

4. The programmable interconnect cell as defined by claim 3 and further including a first conductive line and a second conductive line connected to the first and second source/drains of the sense transistor for sensing current flow through the sense transistor.

5. The programmable interconnect cell as defined by claim 4 wherein the first and second conductive lines comprise metal lines running perpendicular to the first polysilicon line and the second polysilicon line.

6. The programmable interconnect cell as defined by claim 5 wherein the first polysilicon line is restricted to the first field effect transistor, the buried bitline, and the second field effect transistor.

7. A programmable interconnect cell as defined by claim 6 wherein the first polysilicon line and the second polysilicon line are self-aligned.

8. The programmable interconnect cell as defined by claim 4 wherein the buried bitline is between the switch transistor and the sense transistor.

9. The programmable interconnect cell as defined by claim 4 wherein the buried bitline is at one end of the cell with the sense transistor between the switch transistor and the buried bitline.

10. The programmable interconnect cell as defined by claim 2 wherein the buried bitline is connected to a source/drain of the sense transistor.

11. An array of programmable interconnect cells in a semiconductor body for selectively connecting circuit nodes in an integrated circuit comprising
    a plurality of interconnect cells arranged in rows and columns and each programmable to connect and disconnect circuit modes,
    each cell having a first field effect switch transistor aligned with first field effect transistors of other cells in a first column, a second field effect sense transistor aligned with second field effect transistors of other cells in a second column, and a buried bitline in juxtaposition with the first field effect transistor and the second field effect transistor and aligned with buried bitlines in a third column, each cell being aligned with other cells in the same row,
    each cell having a first polysilicon line running between and spaced from source/drains of the first field effect transistor, between and spaced from source/drains of the second field effect transistor and over the buried bitline and functioning as a common floating gate, a second polysilicon line overlying the first polysilicon line and functioning as a common control gate, the second polysilicon line extending to other cells in a row, and a tunnel oxide separating the first polysilicon line and the buried bitline whereby programming of a cell is effected through the buried bitline, and the sensing of conducting and nonconducting states of a node is through the second field effect transistor.

12. The array as defined by claim 11 and further including first and second metal lines contacting source/drains of the second field effect transistor and extending to other cells in a column.

13. The array as defined by claim 12 wherein the buried bitline in each cell is between the switch transistor and the sense transistor.

14. The array as defined by claim 12 wherein the sense transistor in each cell is between the switch transistor and the buried bitline.

15. The array as defined by claim 11 wherein the buried bitline is connected to a source/drain of the sense transistor in each cell.

16. An array of programmable interconnect cells in a semiconductor body for selectively connecting circuit nodes in an integrated circuit comprising a plurality of interconnect cells arranged in rows and columns and each programmable to connect and disconnect circuit nodes, each cell including
  a) a field effect switch transistor formed in the semiconductor body abutting the major surface, said switch transistor having first and second source/drains connected to a first and a second circuit node, a floating gate for storing charge, and a control gate for turning said first field effect transistor on and off responsive to charge on the floating gate,
  b) a field effect sense transistor formed in the semiconductor body abutting the major surface and spaced from the switch transistor, said sense transistor having first and second source/drains, a floating gate for storing charge, and a control gate for turning said sense transistor on and off responsive to charge on the floating gate, and
  c) a buried bitline formed in the semiconductor body abutting the major surface in juxtaposition with the switch transistor and the sense transistor, a floating gate overlying the buried bitline and separated therefrom by a tunnel oxide, and a control gate overlying the floating gate, the floating gate of the switch transistor, the sense transistor and the buried bitline being interconnected, and the control gate of the switch transistor, the sense transistor, and the bitline being interconnected.

17. The array as defined by claim 16 wherein the floating gates comprise a first polysilicon line.

18. The array as defined by claim 17 wherein the control gates comprise a second polysilicon line.

19. The array as defined by claim 18 and further including a first conductive line and a second conductive line connected to the first and second source/drains of the sense transistor for sensing current flow through the sense transistor.

20. The array as defined by claim 19 wherein the first and second conductive lines comprise metal lines running perpendicular to the first polysilicon line and the second polysilicon line.

21. The array as defined by claim 20 wherein the first polysilicon line is restricted to the first field effect transistor, the buried bitline, and the second field effect transistor.

22. The array as defined by claim 21 wherein the first polysilicon line and the second polysilicon line are self-aligned.

23. The array as defined by claim 22 wherein the switch transistor is aligned in a first column with switch transistors in other cells, the sense transistor is aligned in a second column with sense transistors in other cells, and the buried bitline is aligned in a third column with buried bitlines in other columns.

24. The array as defined by claim 23 wherein each cell is aligned in a row with other cells.

25. The array as defined by claim 24 wherein the buried bitline in each cell is between the switch transistor and the sense transistor.

26. The array as defined by claim 24 wherein the sense transistor in each cell is between the switch transistor and the buried bit line.

27. The array as defined by claim 18 wherein the buried bit line in each cell is connected to a source/drain of the sense transistor.

28. The array as defined by claim 16 wherein the switch transistor is aligned in a first column with switch transistors in other cells, the sense transistor is aligned in a second column with sense transistors in other cells, and the buried bitline is aligned in a third column with buried bitlines in other columns.

29. The array as defined by claim 28 wherein each cell is aligned in a row with other cells.

* * * * *